United States Patent [19]
Lu

[11] Patent Number: 6,137,681
[45] Date of Patent: Oct. 24, 2000

[54] THERMAL MODULE

[75] Inventor: Chun-Hsin Lu, Taipei, Taiwan

[73] Assignee: Foxconn Precision Components Co., Ltd., Taipei Hsien, Taiwan

[21] Appl. No.: 09/222,583

[22] Filed: Dec. 28, 1998

[30] Foreign Application Priority Data

Aug. 7, 1998 [TW] Taiwan ................................. 87212925

[51] Int. Cl.⁷ ..................................................... H05K 7/20
[52] U.S. Cl. .......................... 361/697; 174/15.2; 361/700
[58] Field of Search ..................................... 361/687, 695, 361/697, 699, 700; 257/722; 174/15.2; 62/259.2; 165/80.3, 80.4, 104.33

[56] References Cited

U.S. PATENT DOCUMENTS

| | | |
|---|---|---|
| 5,339,214 | 8/1994 | Nelson . |
| 5,458,189 | 10/1995 | Larson . |
| 5,875,095 | 2/1999 | Webb . |
| 5,917,697 | 6/1999 | Wang . |
| 5,949,648 | 9/1999 | Liao . |
| 5,959,837 | 9/1999 | Yu . |
| 5,960,862 | 10/1999 | Hu . |
| 6,020,820 | 2/2000 | Chiang . |

*Primary Examiner*—Gerald Tolin
*Attorney, Agent, or Firm*—Wei Te Chung

[57] ABSTRACT

A thermal module for dissipating heat generated by a component of a computer consists of a heat sink having a top face defining a cavity exposed to a front side of the heat sink and a bottom face defining a passage fixedly receiving an end portion of a heat pipe. The other end of the heat pipe thermally connects with the heat generating component. A number of round rods are integrally formed with the heat sink and extend into the cavity. A fan mounting plate is fixed to the heat sink and has a top face defining a recession for receiving a fan therein, an opening communicating with the recession and a conduit above the round rods and in communication with the fan via the opening. The conduit has a spiral portion and a rectangular outlet. When the fan is activated, an air flow is generated and flows into the conduit via the opening. The spiral portion of the conduit causes the air flow to have a vortical flowing pattern whereby a strong air flow flows through the round rods to effectively displace heat dissipated therefrom. The heated air exists the thermal module via the outlet of the conduit.

10 Claims, 3 Drawing Sheets

THERMAL MODULE

BACKGROUND OF THE INVENTION

1. Field of the Invention

The present invention relates to a thermal module, and particularly to a thermal module for dissipating heat from a heat generating component of a notebook computer.

2. The Prior Art

To dissipate heat from a heat generating component of a notebook computer, a thermal module consisting of an efficient heat-conductive heat pipe, a heat sink and a fan is used. The heat pipe connects the component to be cooled to the heat sink with the fan attached thereto whereby heat can be transmitted to the heat sink via the heat pipe and dissipated to the surrounding atmosphere by an air flow generated by the fan through the heat sink. Although the prior art thermal module works effectively, the height thereof is too large to meet the trend of computer technology which requires the notebook computer to be as space efficient as possible. Lowering the height of the thermal module, particularly the combination of the heat sink and fan, usually results in a reduced heat dissipating effectiveness thereof. Hence, a low profile thermal module having a good heat dissipating effectiveness is needed.

SUMMARY OF THE INVENTION

Accordingly, an objective of the present invention is to provide a low profile thermal module which can effectively dissipate heat from a heat generating component of a computer device.

Another objective of the present invention is to provide a thermal module for dissipating heat from a heat-generating component of a computer wherein the module has a compact design while achieving a good heat dissipating effectiveness.

To fulfill the above mentioned objectives, according to a preferred embodiment of the present invention, a thermal module for dissipating heat generated by a component in a computer consists of heat sink defining a lower passage and an upper cavity exposed to a side of the heat sink. A highly heat conductive heat pipe has an end portion fixedly received in the passage and in thermal connection with the heat sink and another end portion extending to thermally connect with the component to be cooled, whereby heat generated by the component can be transmitted to the heat sink. A number of round rods are integrally formed with the heat sink and extend into the cavity for dissipating the heat of the heat sink received from the heat pipe. A fan mounting plate is fixed to the heat sink and defines a recession in a top face thereof for receiving a fan therein and a conduit in a bottom face thereof exposed to the top face of the heat sink and above the round rods. The conduit communicates with the fan via an opening defined in the plate.

When the fan is activated, an air flow is generated through the conduit via the opening. The air flow flows through the round rods to displace heat dissipated therefrom away from the thermal module. The conduit has a spiral portion causing air flowing into the conduit to have a vortical flowing pattern whereby a strong air flow is generated through the round rods, and a rectangular outlet through which the air encompassing the heat dissipated from the round rods can flow out of the thermal module.

DETAILED DESCRIPTION OF THE PREFERRED EMBODIMENT

Reference will now be made in detail to the preferred embodiment of the present invention.

Figure 1:
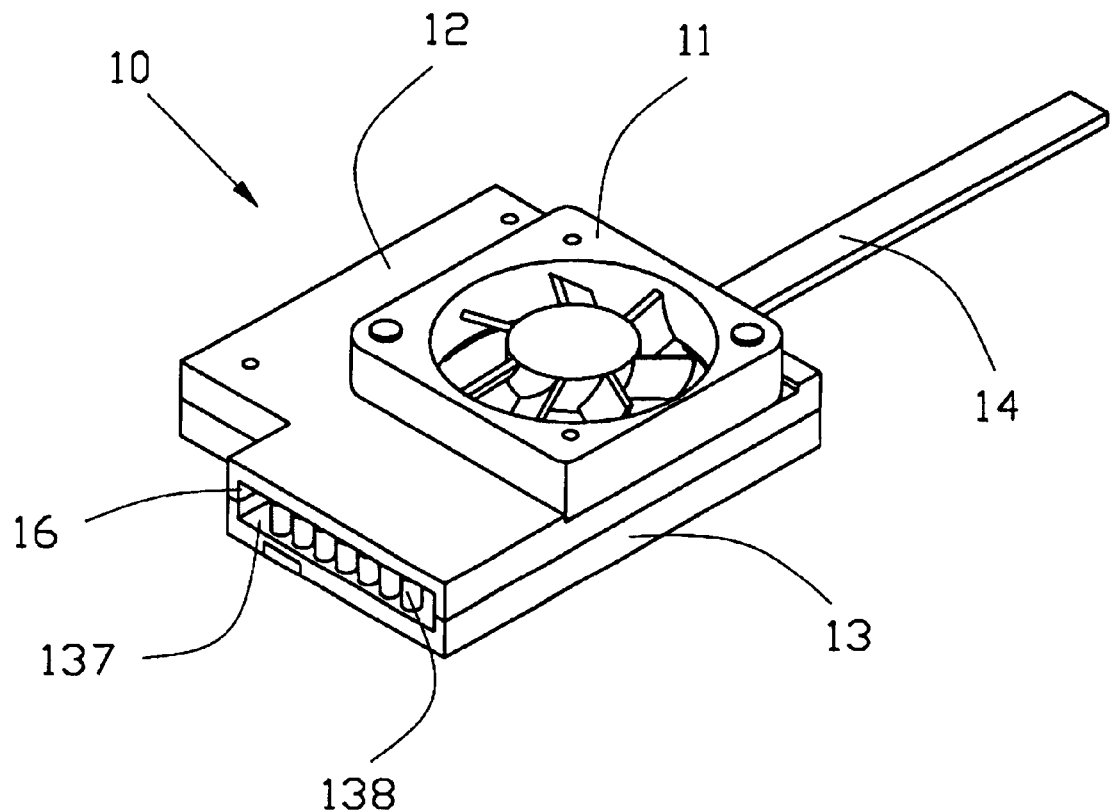
FIG. 1 is a perspective view of a thermal module in accordance with the present invention.
Figure 2:
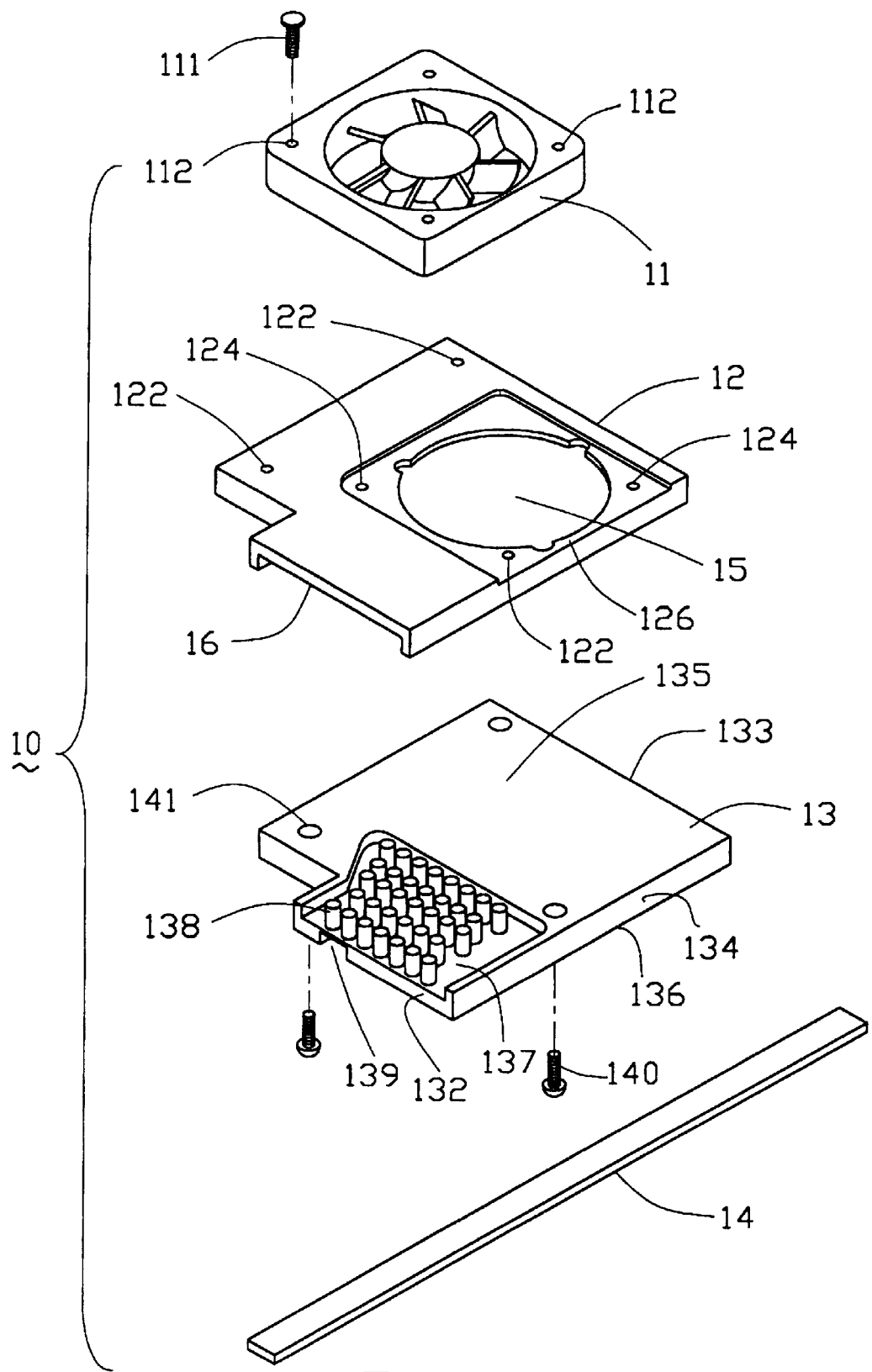
FIG. 2 is an exploded view of the thermal module of FIG. 1.
Figure 3:
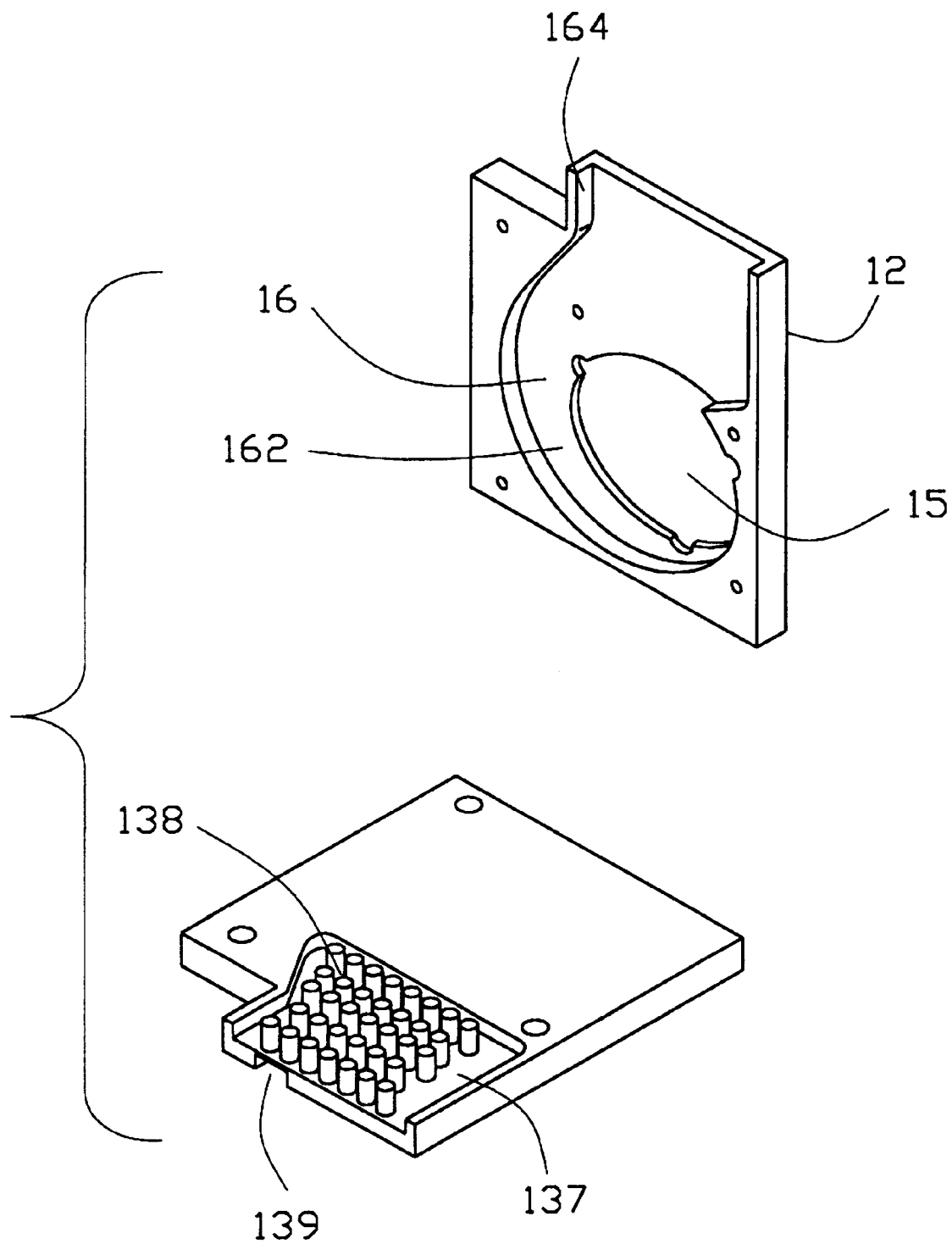
FIG. 3 is an exploded view of a heat sink and a fan mounting plate of the thermal module of FIG. 1 wherein a bottom face of the fan mounting plate is shown.

Referring to FIGS. 1 to 3, a thermal module 10 for use in a computer (particularly a notebook type computer) consists of a heat pipe 14, a fan mounting plate 12, a heat sink 13 and a fan 11. The heat pipe 14 is formed to be an elongate bar having a generally rectangular cross section. The structure of the heat pipe 14 and its function are well known by those skilled in the art of notebook computer heat dissipating technology; thus, a detailed explanation thereof is omitted herein.

The heat sink 13 is formed by aluminum die casting to have a generally L-shaped, plate-like configuration with a front side 132, a rear side 133, two lateral sides 134, a top face 135 and a bottom face 136. The bottom face 136 defines a passage 139 from the front side 132 to the rear side 133. The heat pipe 14 has a front end portion fixedly received in the passage 139 by heat conductive adhesive (for example, thermal epoxy) to thermally connect with the heat sink 13 and a rear end portion for thermally connecting with a heat generating component (not shown) of the computer. The top face 135 defines a cavity 137 above the passage 139 and exposed to the front side 132 of the heat sink 13. A number of round rods 138 are integrally formed with the heat sink and extend into the cavity 137 for dissipating heat absorbed by the heat sink 13 from the heat pipe 14. Three through holes 141 are defined in the heat sink 13 for extension of three screws 140 (only two shown) therethrough. Each rod 138 has a height substantially equal to a depth of the cavity 137.

The fan mounting plate 12 is also formed by aluminum die casting to have an L-shaped configuration corresponding to that of the heat sink 13. The fan mounting plate 12 defines a rectangular recession 126 in a top face thereof for receiving the fan 11 therein, a circular opening 15 in the recession 126 and an air flow guiding conduit 16 in a bottom face of the plate 12 communicating with the recession 126 via the opening 15. The fan 11 is mounted within the recession 126 of the plate 12 by respectively extending two screws 111 (only one shown) through two holes 112 defined in the fan 11 to threadedly engage with two threaded holes 124 defined in the plate 12 beside the opening 15. The fan mounting plate 12 is fixed to the heat sink 13 by extending the three screws 140 through the three holes 141 defined in the heat sink to threadedly engage with three threaded holes 122 defined in the fan mounting plate 12 whereby a front portion of the conduit 16 is located above the round rods 138. The opening 15 functions as an inlet for air flow generated by the fan 11 into the conduit 16. The conduit 16 effectively guides the air flow through the round rods 138 to a front side of the thermal module 10 which is exposed to the surrounding atmosphere when the thermal module 10 is mounted in the computer, whereby heat absorbed by the heat sink 13 from the heat generating component via the heat pipe 14 is effectively dissipated to the atmosphere. The guiding conduit 16 includes a generally spiral portion 162 and a rectangular outlet 164. The spiral portion 162 causes the air flowing into the conduit 16 to have a vortical flowing pattern whereby a strong air flow is generated to flow through the round rods 138 to effectively displace heat dissipated therefrom. The heated air then exits the thermal module 10 via the rectangular outlet 164.

From the above disclosure, the present invention discloses a thermal module having a compact design with a low profile while achieving a good heat dissipating effectiveness; thus, the present invention contributes to cooling applications of the computer industry.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. A thermal module for dissipating heat generated by a component in a computer, comprising:
   a metallic heat sink having a bottom face defining a passage, a top face defining a cavity exposed to a side of the heat sink, and a heat dissipating means located in the cavity;
   a fan mounting plate mounted on the heat sink and defining a conduit above the heat dissipating means;
   a fan mounted on the fan mounting plate for generating an air flow through the conduit to displace heat dissipated by the heat dissipating means away from the thermal module; and
   a heat pipe having a first end portion received in the passage of the heat sink and in thermal connection therewith and a second end portion adapted to thermally connect with the component in the computer.

2. The thermal module in accordance with claim 1, wherein the heat dissipating means comprises a number of round rods.

3. The thermal module in accordance with claim 2, wherein each rod has a height substantially equal to a depth of the cavity.

4. The thermal module in accordance with claim 2, wherein the round rods are integrally formed with the heat sink by die casting.

5. The thermal module in accordance with claim 3, wherein the round rods are integrally formed with the heat sink by die casting.

6. The thermal module in accordance with claim 1, wherein the fan mounting plate defines a recession for receiving the fan therein.

7. The thermal module in accordance with claim 1, wherein the conduit of the fan mounting plate has a spiral portion communicating with the fan via an opening in the fan mounting plate and an outlet, the spiral portion causing the air flow into the conduit to have a vortical flowing pattern whereby a strong air flow flows through the heat dissipating means to effectively displace heat dissipated therefrom, the heated air existing the thermal module via the outlet.

8. The thermal module in accordance with claim 7, wherein the outlet has a rectangular shape.

9. The thermal module in accordance with claim 1, wherein the cavity is located just above the passage.

10. The thermal module in accordance with claim 1, wherein both the fan mounting plate and the heat sink have an L-shaped configuration corresponding to each other.

* * * * *